United States Patent
Hsu et al.

(10) Patent No.: US 11,737,285 B2
(45) Date of Patent: Aug. 22, 2023

(54) MEMORY ARRAY HAVING STRAP REGION WITH STAGGERED DUMMY MAGNETIC STORAGE ELEMENTS

(71) Applicant: UNITED MICROELECTRONICS CORP., Hsin-Chu (TW)

(72) Inventors: Po-Kai Hsu, Tainan (TW); Hui-Lin Wang, Taipei (TW); Kun-I Chou, Tainan (TW); Ching-Hua Hsu, Kaohsiung (TW); Ju-Chun Fan, Tainan (TW); Yi-Yu Lin, Taichung (TW); Hung-Yueh Chen, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 288 days.

(21) Appl. No.: 17/202,296

(22) Filed: Mar. 15, 2021

(65) Prior Publication Data

US 2022/0271088 A1    Aug. 25, 2022

(30) Foreign Application Priority Data

Feb. 22, 2021    (CN) .......................... 202110198021.9

(51) Int. Cl.
*H10B 61/00*    (2023.01)
*H10N 50/80*    (2023.01)

(52) U.S. Cl.
CPC ............. *H10B 61/22* (2023.02); *H10N 50/80* (2023.02)

(58) Field of Classification Search
CPC ....... H10B 61/22; H10N 50/80; G11C 11/161; G11C 8/14; G11C 11/06078; G11C 11/15
See application file for complete search history.

(56) References Cited

U.S. PATENT DOCUMENTS

| | | | | | |
|---|---|---|---|---|---|
| 5,986,925 | A | * | 11/1999 | Naji | G11C 11/5607 365/158 |
| 6,256,224 | B1 | * | 7/2001 | Perner | G11C 11/16 365/171 |
| 6,466,475 | B1 | * | 10/2002 | Nickel | G11C 11/15 365/158 |
| 7,362,609 | B2 | * | 4/2008 | Harrison | H01L 21/8213 365/177 |
| 2002/0044481 | A1 | * | 4/2002 | Hidaka | G11C 11/15 365/158 |
| 2010/0123207 | A1 | * | 5/2010 | Zhong | H10B 61/00 430/5 |
| 2010/0232210 | A1 | * | 9/2010 | Kajiyama | H10B 61/22 365/210.1 |
| 2012/0063215 | A1 | * | 3/2012 | Takahashi | G11C 11/1693 365/158 |
| 2012/0243286 | A1 | * | 9/2012 | Inaba | G11C 5/06 365/72 |
| 2012/0281461 | A1 | * | 11/2012 | Asao | G11C 11/1659 365/158 |

(Continued)

*Primary Examiner* — Kimberly N Rizkallah
*Assistant Examiner* — Pratiksha Jayant Lohakare
(74) *Attorney, Agent, or Firm* — Winston Hsu

(57) ABSTRACT

A memory array includes at least one strap region having therein a plurality of source line straps and a plurality of word line straps, and at least two sub-arrays having a plurality of staggered, active magnetic storage elements. The at least two sub-arrays are separated by the strap region. A plurality of staggered, dummy magnetic storage elements is disposed within the strap region.

15 Claims, 12 Drawing Sheets

(56) References Cited

U.S. PATENT DOCUMENTS

| | | | | |
|---|---|---|---|---|
| 2012/0314469 | A1* | 12/2012 | Shuto | G11C 11/1673 |
| | | | | 365/72 |
| 2014/0043924 | A1* | 2/2014 | Kim | H10N 50/01 |
| | | | | 365/201 |
| 2015/0069480 | A1* | 3/2015 | Kanaya | H10B 61/22 |
| | | | | 257/295 |
| 2017/0104029 | A1* | 4/2017 | Li | H10N 50/10 |
| 2017/0309321 | A1* | 10/2017 | Chang | G11C 11/1657 |
| 2019/0206928 | A1* | 7/2019 | Li | H10N 50/80 |
| 2020/0381037 | A1* | 12/2020 | Kim | H10B 63/845 |
| 2021/0098685 | A1* | 4/2021 | Liou | H10N 50/01 |

\* cited by examiner

MEMORY ARRAY HAVING STRAP REGION WITH STAGGERED DUMMY MAGNETIC STORAGE ELEMENTS

BACKGROUND OF THE INVENTION

1. Field of the Invention

The present invention relates to a semiconductor device, in particular to a high-density magnetoresistive random access memory (MRAM) array.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

It is one object of the present invention to provide a high-density magnetoresistive random access memory (MRAM) array to solve the above-mentioned shortcomings or deficiencies of the prior art.

According to one aspect of the invention, a memory array includes at least one strap region comprising a plurality of source line straps and a plurality of word line straps, and at least two sub-arrays comprising a plurality of staggered, active magnetic storage elements. The at least two sub-arrays are separated by the strap region. A plurality of staggered, dummy magnetic storage elements is disposed within the strap region.

According to some embodiments, the plurality of staggered, active magnetic storage elements and the plurality of staggered, dummy magnetic storage elements are uniformly distributed on the at least two sub-arrays and the strap region.

According to some embodiments, the plurality of staggered, dummy magnetic storage elements comprises dummy magnetic tunneling junction (MTJ) elements.

According to some embodiments, bottom electrodes of the dummy MTJ elements are not electrically connected to the plurality of source line straps or the plurality of word line straps.

According to some embodiments, the plurality of source line straps comprises a plurality of first source line straps extending along a first direction and a plurality of second source line straps extending along the first direction.

According to some embodiments, the plurality of first source line straps and the plurality of second source line straps extending along the first direction sandwich about the plurality of word line straps extending along the first direction.

According to some embodiments, each of the plurality of first source line straps is connected to a common source line extending along a second direction.

According to some embodiments, the first direction is orthogonal to the second direction.

According to some embodiments, the memory array further includes a first dummy diffusion region extending along the first direction, wherein the first dummy diffusion region is disposed directly under the plurality of first source line straps.

According to some embodiments, the memory array further includes a second dummy diffusion region extending along the first direction, wherein the second dummy diffusion region is disposed directly under the plurality of second source line straps.

According to some embodiments, no diffusion region is disposed between the first dummy diffusion region and the second dummy diffusion region.

According to some embodiments, each of the plurality of staggered, active magnetic storage elements is electrically connected to a storage node pad through a tungsten via.

According to some embodiments, no tungsten via is disposed within the strap region.

According to some embodiments, the memory array further includes a plurality of gate lines extending along the second direction.

According to some embodiments, the plurality of staggered, active magnetic storage elements comprises a plurality of first active magnetic storage elements arranged in a first column and a plurality of second active magnetic storage elements arranged in a second column, wherein the plurality of first active magnetic storage elements arranged in the first column and the plurality of second active magnetic storage elements arranged in the second column are aligned with the plurality of gate lines extending along the second direction, respectively.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

The present invention pertains to a high-density memory layout, in particular a high-density magnetoresistive random access memory (MRAM) array. The special technical features includes: a plurality of staggered dummy magnetic storage elements may be arranged in a strap region between two sub-arrays, so that the active magnetic storage elements and the dummy magnetic storage elements of the memory array are evenly distributed in the two sub-arrays and the strap region in a staggered arrangement. Therefore, a high-density memory layout can be realized.

In the following detailed description, Mn represents the different metal layers in the metal interconnect structure, where n is a positive integer, for example, M1 represents the first metal layer in the metal interconnect structure, and M2 represents the second metal layer in the metal interconnect structure, and so on. Vn represents the different conductive vias in the metal interconnection structure, for example, V1 represents the conductive via connecting M1 to M2, and V2 represents the conductive via connecting M2 to M3, and so on.

Figure 1:
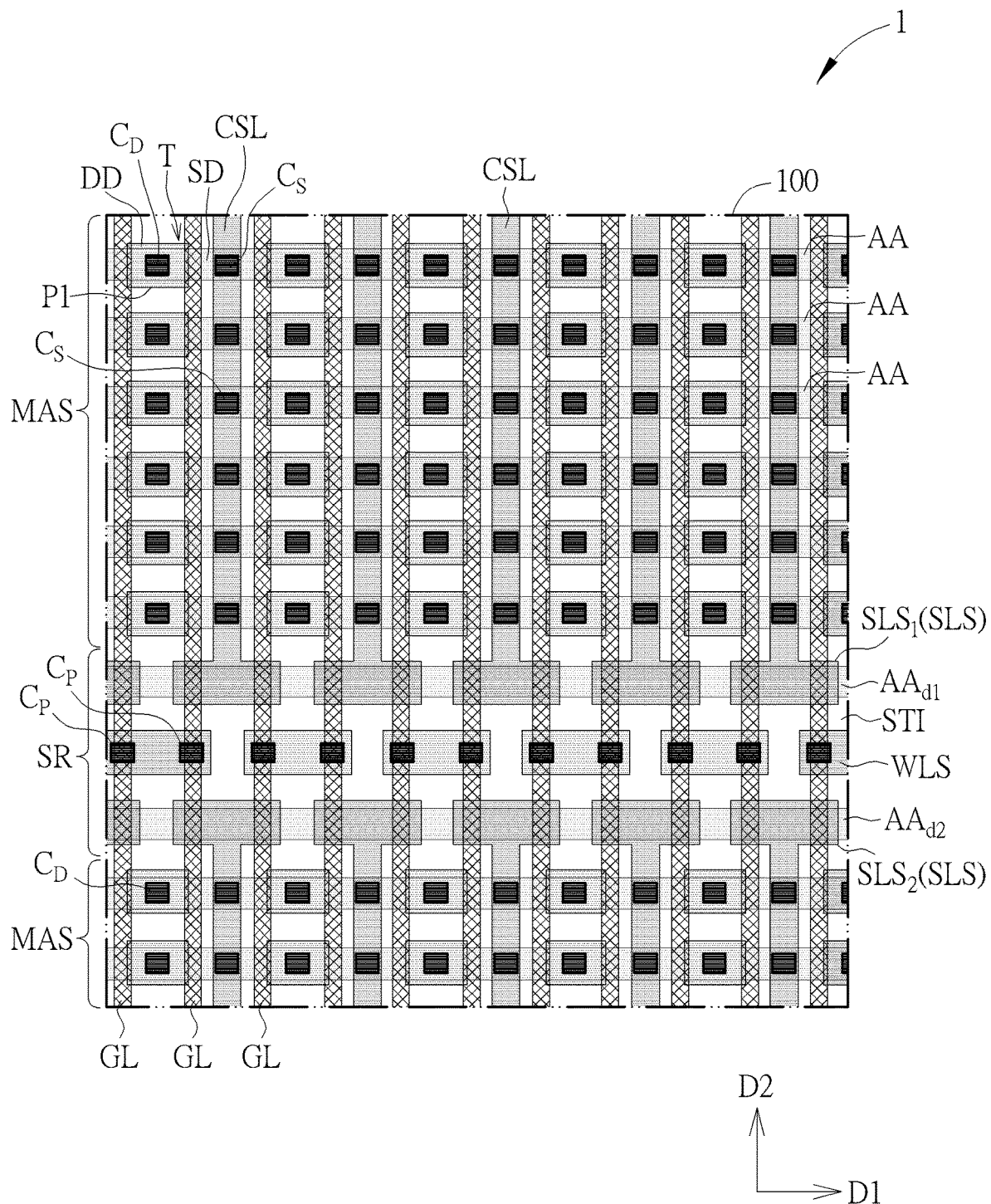
FIG. 1 is a schematic diagram of a memory array according to an embodiment of the present invention, which mainly shows active areas, polysilicon gate lines, common source lines located on the M1 metal layer, source line straps and word line straps.

Please refer to FIG. 1, which is a schematic diagram of a memory array according to an embodiment of the present invention, which mainly shows active areas, polysilicon gate lines, common source lines located on the M1 metal layer, source line straps and word line straps. As shown in FIG. 1, the memory array 1 includes at least two sub-arrays MAS and at least one strap region SR. According to an embodiment of the present invention, the strap region SR is a strip-shaped region extending along a first direction D1, and the two sub-arrays MAS are separated by the strap region SR. According to an embodiment of the present invention, the memory array 1 further includes a plurality of polysilicon gate lines GL extending along a second direction D2 and a plurality of active areas AA extending along the first direction D1 formed in a semiconductor substrate 100. According to an embodiment of the present invention, the first direction D1 is orthogonal to the second direction D2. According to an embodiment of the present invention, the active areas AA are isolated from each other by the shallow trench isolation areas STI.

According to an embodiment of the present invention, the polysilicon gate lines GL pass through the two sub-arrays MAS and the strap region SR, and form transistors T at the intersections between the polysilicon gate lines and the active areas AA in the sub-array MAS. According to an embodiment of the present invention, the transistor T includes a source region SD and a drain region DD, for example, an $N^+$ doped region, but is not limited thereto. According to an embodiment of the present invention, a first dummy diffusion regions AAd1 and a second dummy diffusion regions AAd2 extending along the first direction D1, which are respectively adjacent to the two sub-arrays MAS, are further provided in the strap region SR. According to an embodiment of the present invention, the first dummy diffusion region AAd1 and the second dummy diffusion region AAd2 help improve the yield of memory cells located at the edge of the sub-arrays MAS.

According to an embodiment of the present invention, a plurality of source line straps SLS and a plurality of word line straps WLS located in the M1 metal layer are further provided in the strap region SR. The plurality of source line straps SLS includes a plurality of first source line straps $SLS_1$ extending along the first direction D1 and a plurality of second source line straps $SLS_2$ extending along the first direction D1. According to an embodiment of the present invention, the plurality of first source line straps $SLS_1$ are substantially aligned with the first dummy diffusion region AAd1, and the plurality of second source line straps $SLS_2$ are substantially aligned with the second dummy diffusion region AAd2. According to an embodiment of the present invention, no diffusion area is provided between the first dummy diffusion region AAd1 and the second dummy diffusion region AAd2.

According to an embodiment of the present invention, a plurality of word line straps WLS, which is also located at the M1 metal layer, may be provided in the strap region SR. According to an embodiment of the present invention, the plurality of first source line straps $SLS_1$ extending along the first direction D1 and the plurality of second source line straps $SLS_2$ extending along the first direction D1 sandwich about the plurality of word lines with WLS extend along the first direction D1. According to an embodiment of the present invention, the word line strap WLS, the first source line strap $SLS_1$ and the second source line strap $SLS_2$ are arranged in a staggered manner. According to an embodiment of the present invention, each word line strap WLS is electrically connected to two adjacent polysilicon gate lines GL through two contact plugs $C_P$.

According to an embodiment of the present invention, the first source line straps $SLS_1$ are respectively connected to the common source line CSL extending along the second direction D2. According to an embodiment of the present invention, the common source line CSL is electrically connected to the source regions SD of the transistors T through the source contact plugs $C_S$, respectively. According to an embodiment of the present invention, the memory array 1 further includes a plurality of pads P1 located on the drain regions DD of the transistors T and electrically connected to the drain regions DD of the transistors T through the drain contact plugs $C_D$, respectively.

Figure 2:
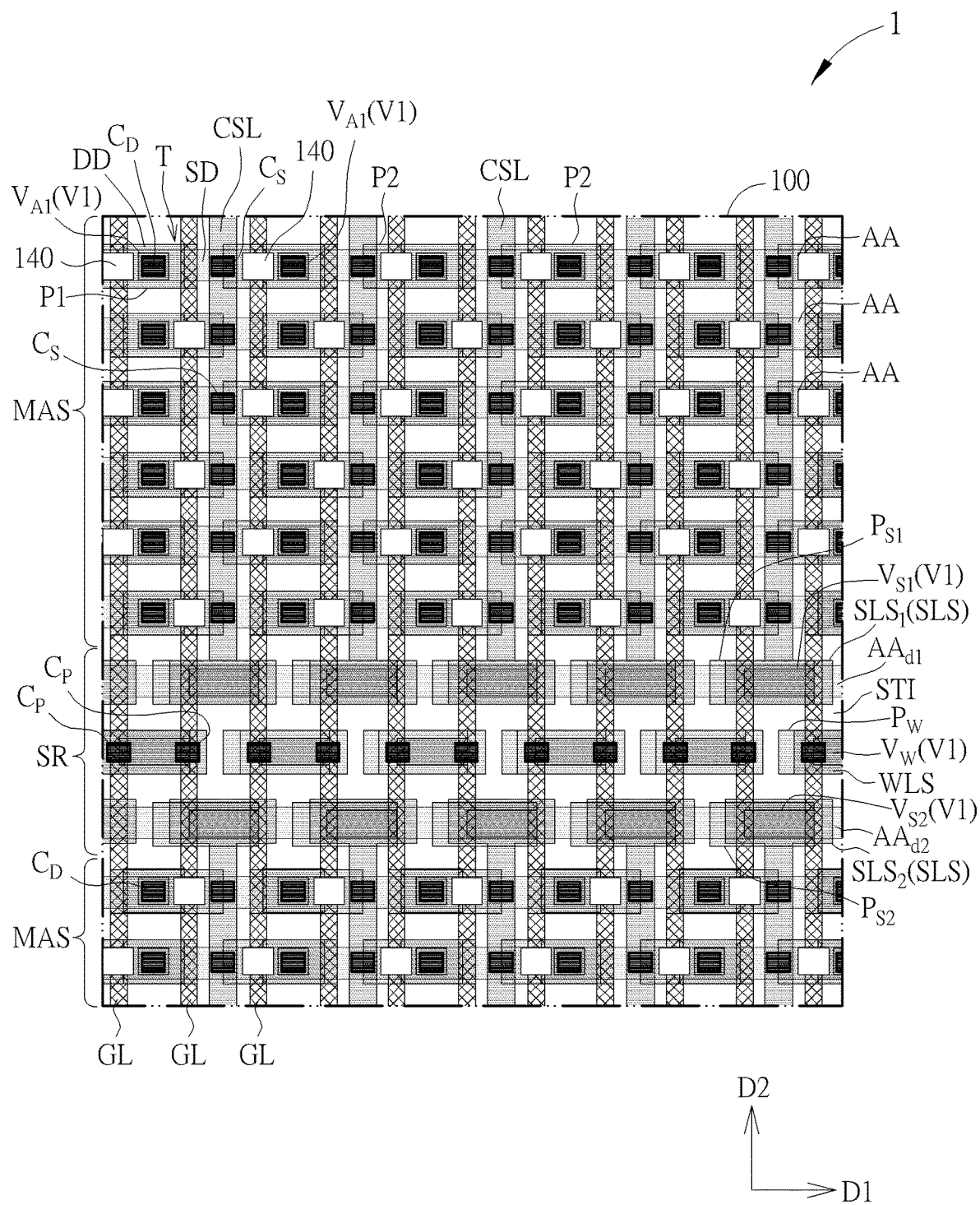
FIG. 2 is a schematic diagram of a memory array according to an embodiment of the present invention, which mainly shows the positions of conductive vias, storage node pads, and tungsten vias.

Please refer to FIG. 2, which is a schematic diagram of a memory array according to an embodiment of the present invention, which mainly shows the positions of conductive vias, storage node pads, and tungsten vias. As shown in FIG. 2, the memory array 1 further includes a plurality of V1 conductive vias, including a conductive via $V_{A1}$ provided on each of the pads P1 in the sub-arrays MAS, a conductive via $V_{S1}$ on each of the first source line straps SLS1, a the conductive via $V_{S2}$ on each of the second source line straps SLS2, and a conductive via $V_W$ on each of the word line straps WLS in the strap region SR. According to an embodiment of the present invention, a width of the conductive via $V_{S1}$ and a width of the conductive via $V_W$ in the first direction D1 are greater than a width of the conductive via $V_{A1}$ in the first direction D1.

According to an embodiment of the present invention, the memory array 1 further includes a plurality of storage node pads P2 in the sub-arrays MAS, which are electrically connected to the conductive vias $V_{A1}$, respectively, and located on the M2 metal layer, pads $P_{S1}$ electrically connected to the conductive vias $V_{S1}$ in the strap region SR, pads $P_{S2}$ electrically connected to the conductive vias $V_{S2}$ in the strap region SR, and pads $P_W$ electrically connected to the conductive vias $V_W$ in the strap region SR. According to an embodiment of the present invention, each of the storage node pads P2 may have a rectangular outline, the long side of which is parallel to the first direction D1. Each of the storage node pads P2 may partially overlap the underlying polysilicon gate lines GL. According to an embodiment of the present invention, the memory array 1 further includes a plurality of tungsten vias 140 in the sub-arrays MAS, which are respectively electrically connected to the corresponding storage node pads P2. According to an embodiment of the present invention, the plurality of tungsten vias 140 may be arranged in a staggered arrangement and may be substantially aligned with the polysilicon gate lines GL below. According to an embodiment of the present invention, no tungsten vias are arranged on the pads $P_{S1}$, the pads $P_{S2}$, and the pads $P_W$ in the strap region SR.

Figure 3:
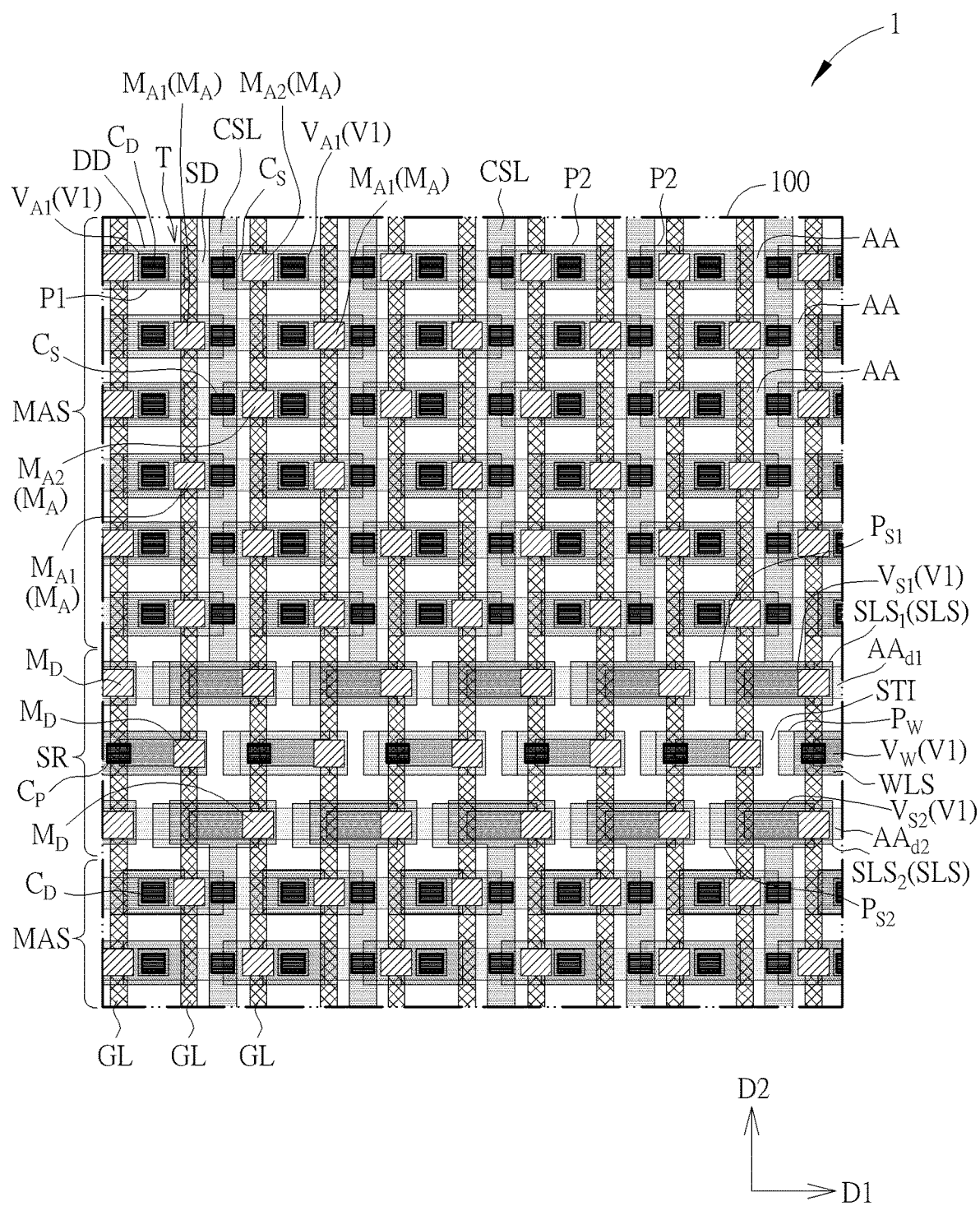
FIG. 3 is a schematic diagram of a memory array according to an embodiment of the present invention, which mainly shows the positions of magnetic storage elements.

Please refer to FIG. 3, which is a schematic diagram of a memory array according to an embodiment of the present invention, which mainly shows the position of the magnetic storage elements. As shown in FIG. 3, the sub-array MAS of the memory array 1 includes a plurality of staggered active magnetic storage elements $M_A$, and the strap region SR includes a plurality of staggered dummy magnetic storage elements $M_D$. According to an embodiment of the present invention, in the sub-arrays MAS, the active magnetic storage elements $M_A$ are disposed on the corresponding tungsten vias 140, that is, the active magnetic storage elements $M_A$ are substantially aligned with the corresponding tungsten vias 140, respectively, and are approximately aligned with the underlying polysilicon gate lines GL, respectively. The active magnetic storage elements $M_A$ are electrically connected to the storage node pads P2, respectively, through the tungsten vias 140.

According to an embodiment of the present invention, the active magnetic storage elements $M_A$ include a plurality of first active magnetic storage elements $M_{A1}$ arranged in a first column and a plurality of second active magnetic storage elements $M_{A2}$ arranged in a second column. The first active magnetic storage elements $M_{A1}$ arranged in the first column and the second active magnetic storage elements $M_{A2}$ arranged in the second column are respectively aligned with corresponding gate lines GL extending in the second direction D2.

According to an embodiment of the present invention, each of the active magnetic storage elements $M_A$ and the dummy magnetic storage elements $M_D$ may include a magnetic tunnel junction (MTJ) element. According to an embodiment of the present invention, the MTJ element may include a multilayer structure, for example, a bottom electrode, a top electrode, and a magnetic tunnel junction structure between the bottom electrode and the top electrode. The magnetic tunnel junction structure may include, but not limited to, a reference layer, a channel layer, a free layer and a cap layer. According to an embodiment of the present invention, the bottom electrode of the MTJ element (dummy MTJ element) of the dummy magnetic storage element $M_D$ is not electrically connected to the source line strap or the word line strap.

According to an embodiment of the present invention, the dummy magnetic storage elements $M_D$ are respectively arranged on the pads $P_{S1}$, the pads $P_{S2}$ and the pads $P_W$ in the strap region SR in a staggered manner. Since there are no tungsten vias arranged on the pads $P_{S1}$, the pads $P_{S2}$, and the pads $P_W$ in the strap region SR, the bottom electrode of the dummy magnetic storage element $M_D$ will not be directly electrically connected to the pads $P_{S1}$, the pads $P_{S2}$, and the pads $P_W$ in the strap region SR. According to an embodiment of the present invention, there are only dielectric layers between the dummy magnetic storage device $M_D$ and the pad $P_{S1}$, between the dummy magnetic storage device $M_D$ and the pad $P_{S2}$, and between the dummy magnetic storage device $M_D$ and the pad $P_W$.

According to an embodiment of the present invention, the staggered active magnetic storage elements $M_A$ and the staggered dummy magnetic storage elements $M_D$ are evenly distributed on the two sub-arrays MAS and the strap region SR. Such a uniform and repeated arrangement of magnetic storage elements can specifically realize a high-density memory layout.

Figure 4:
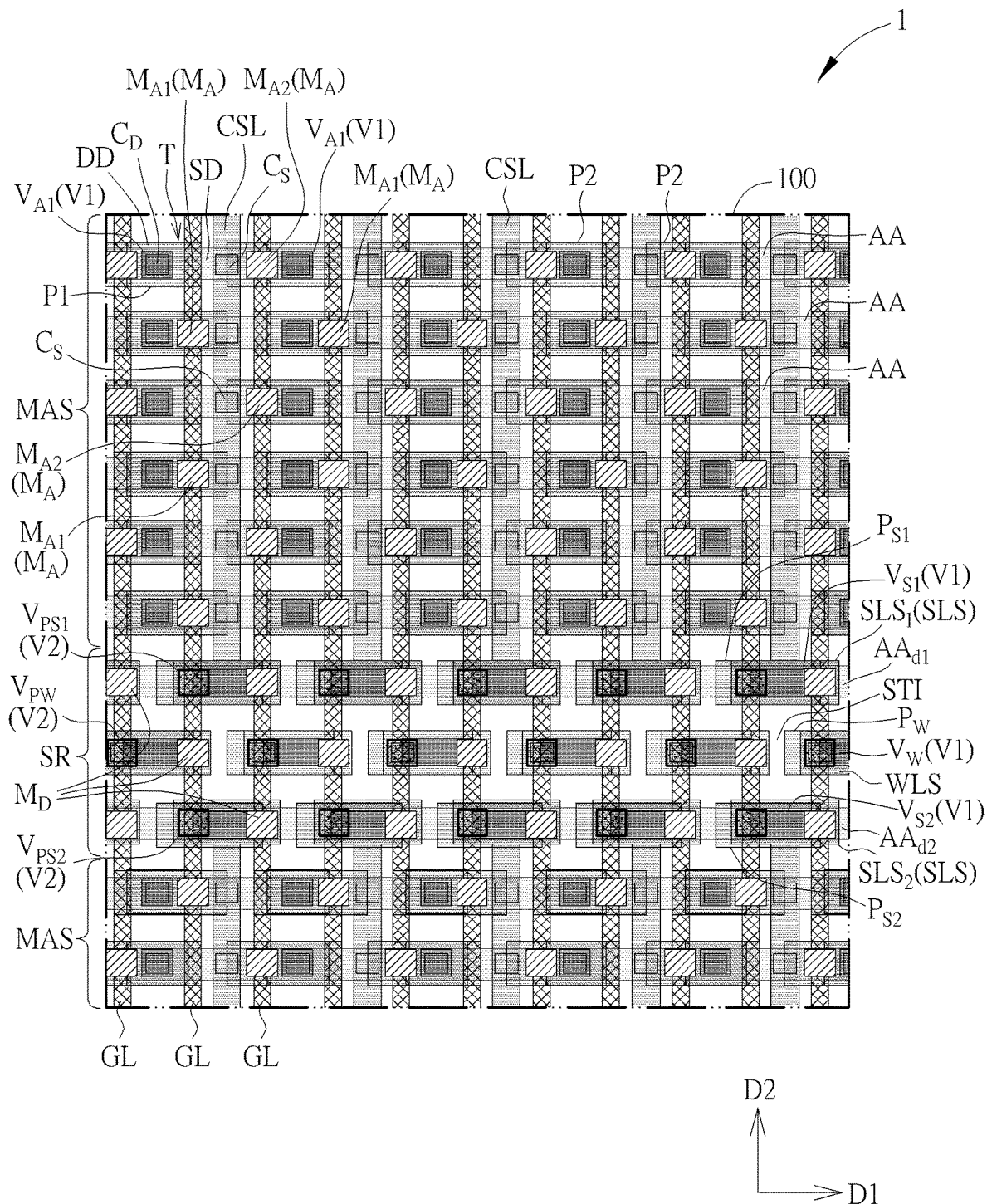
FIG. 4 is a schematic diagram of a memory array according to an embodiment of the present invention, which mainly shows the position of the V2 conductive via in the strap region.

Please refer to FIG. 4, which is a schematic diagram of a memory array according to an embodiment of the present invention, which mainly shows the position of the V2 conductive via in the strap region SR. As shown in FIG. 4, the memory array 1 is additionally provided with staggered conductive vias $V_{PS1}$, conductive vias $V_{PW}$, and conductive vias $V_{PS2}$ in the strap region SR. The conductive vias $V_{PS1}$, conductive vias $V_{PW}$, and conductive vias $V_{PS2}$ are electrically connected to the pads $P_{S1}$, the pads $P_W$, and the pads $P_{S2}$, respectively.

Figure 5:
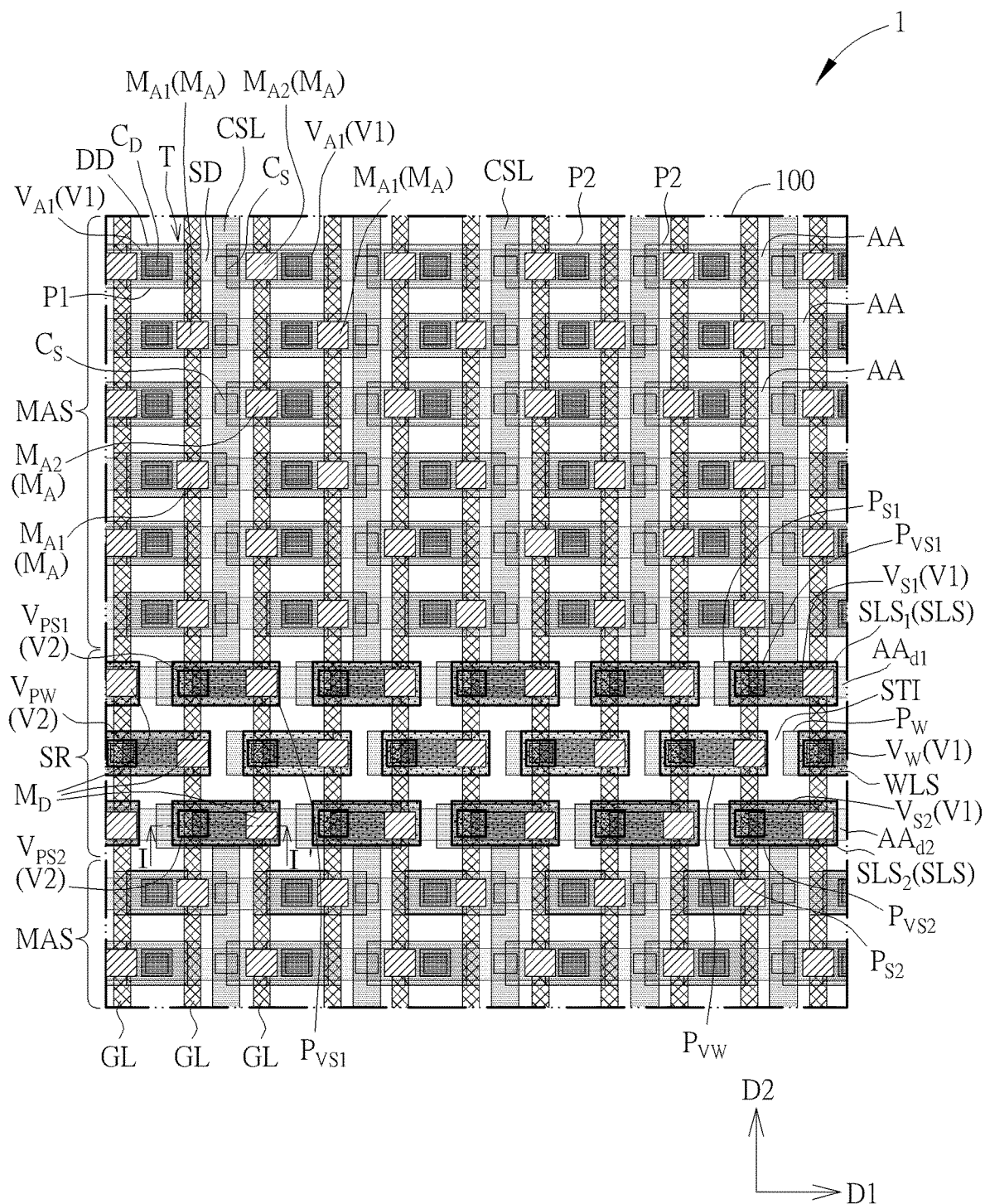
FIG. 5 is a schematic diagram of a memory array according to an embodiment of the present invention, which mainly shows the positions of the pads located on the M3 metal layer in the strap region.

Please refer to FIG. 5, which is a schematic diagram of a memory array according to an embodiment of the present invention, which mainly shows the positions of the pads located on the M3 metal layer in the strap region SR. As shown in FIG. 5, the memory array 1 is additionally provided with pads $P_{VS1}$, pads $P_{VW}$, and pads $P_{VS2}$ located on the M3 metal layer in the strap region SR. The dimensions and the positions of the pads $P_{VS1}$, the pads $P_{VW}$, and the pads $P_{VS2}$ may be substantially the same as the underlying first source line strap SLS1, the word line strap WLS, and the second source line strap SLS2.

According to an embodiment of the present invention, the pad $P_{VS1}$ covers the conductive via $V_{PS1}$ and the adjacent dummy magnetic storage element $M_D$, and electrically connects the top electrode of the dummy magnetic storage element $M_D$ to the conductive via $V_{PS1}$. According to an embodiment of the present invention, the pad $P_{VS2}$ covers the conductive via $V_{PS2}$ and the adjacent dummy magnetic storage element $M_D$, and electrically connects the top electrode of the dummy magnetic storage element $M_D$ to the conductive via $V_{PS2}$. According to an embodiment of the present invention, the pad $P_{VW}$ covers the conductive via $V_{PW}$ and the adjacent dummy magnetic storage element $M_D$, and electrically connects the top electrode of the dummy magnetic storage element $M_D$ to the conductive via $V_{PW}$.

Figure 6:
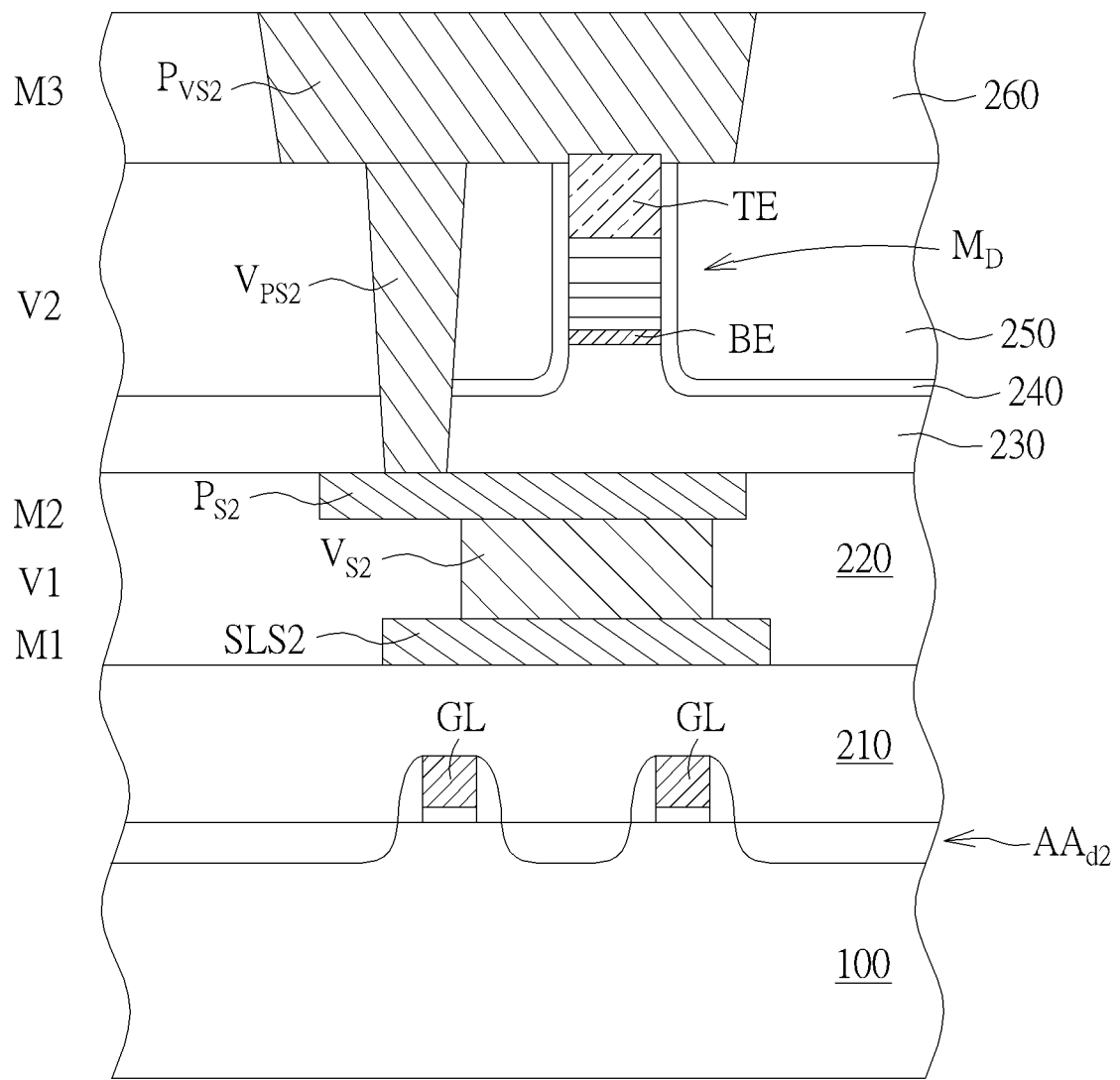
FIG. 6 is a schematic cross-sectional view taken along the line I-I' in FIG. 5.

Please refer to FIG. 6, which is a schematic cross-sectional view taken along the line I-I' in FIG. 5, wherein like regions, layers or elements are designated by like numeral umbers or labels. As shown in FIG. 6, there may be a plurality of dielectric layers on the semiconductor substrate 100, for example, dielectric layers 210-260. As described above, there is only the dielectric layer 230 between the bottom electrode BE of the dummy magnetic memory element $M_D$ and the pad $P_{S2}$, so the bottom electrode BE of the dummy magnetic memory device $M_D$ is not directly connected to the underlying pad $P_{S2}$. According to an embodiment of the present invention, the conductive via $V_{PS2}$ may penetrate through the dielectric layers 230-250 and be electrically connected to the underlying pad $P_{S2}$. The pad $P_{VS2}$ covers the conductive via $V_{PS2}$ and the dummy magnetic storage element $M_D$, and electrically connects the top electrode TE of the dummy magnetic storage element $M_D$ to the conductive via $V_{PS2}$.

Figure 7:
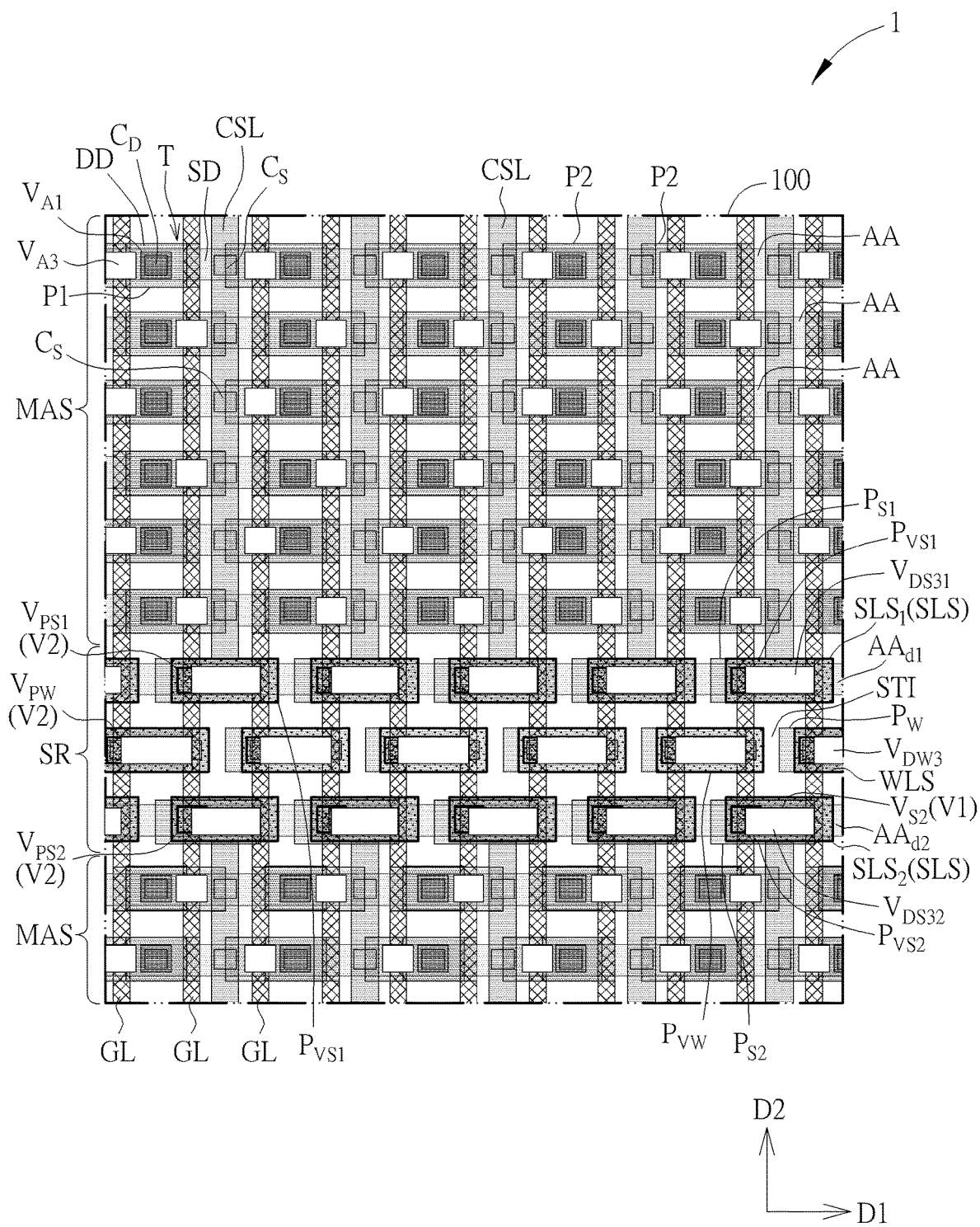
FIG. 7 is a schematic diagram of a memory array according to an embodiment of the present invention, which mainly shows the layout of the V3 conductive vias.

Please refer to FIG. 7, which is a schematic diagram of a memory array according to an embodiment of the present invention, which mainly shows the layout of the V3 conductive vias. As shown in FIG. 7, the memory array 1 further includes a plurality of staggered conductive vias $V_{A3}$ in the sub-arrays MAS, which are approximately aligned with the corresponding active magnetic storage element $M_A$, that is, in the sub-arrays MAS, each of the conductive vias $V_{A3}$ is directly electrically connected to the top electrode of each active magnetic storage element $M_A$. According to an embodiment of the present invention, a plurality of conductive vias $V_{DS31}$, conductive vias $V_{DW3}$, and conductive vias $V_{DS32}$ are arranged in a staggered arrangement in the strap region SR, which are electrically connected to the pad $P_{VS1}$, the pad $P_{VW}$, and the pad $P_{VS2}$, respectively. According to an embodiment of the present invention, the conductive vias $V_{DS31}$, the conductive vias $V_{DW3}$, and the conductive vias $V_{DS32}$ have a rectangular outline, the long side of which is parallel to the first direction D1, and an area of each of the conductive vias $V_{DS31}$, the conductive vias $V_{DW3}$ and the conductive vias $V_{DS32}$ is larger than each conductive via $V_{A3}$.

Figure 8:
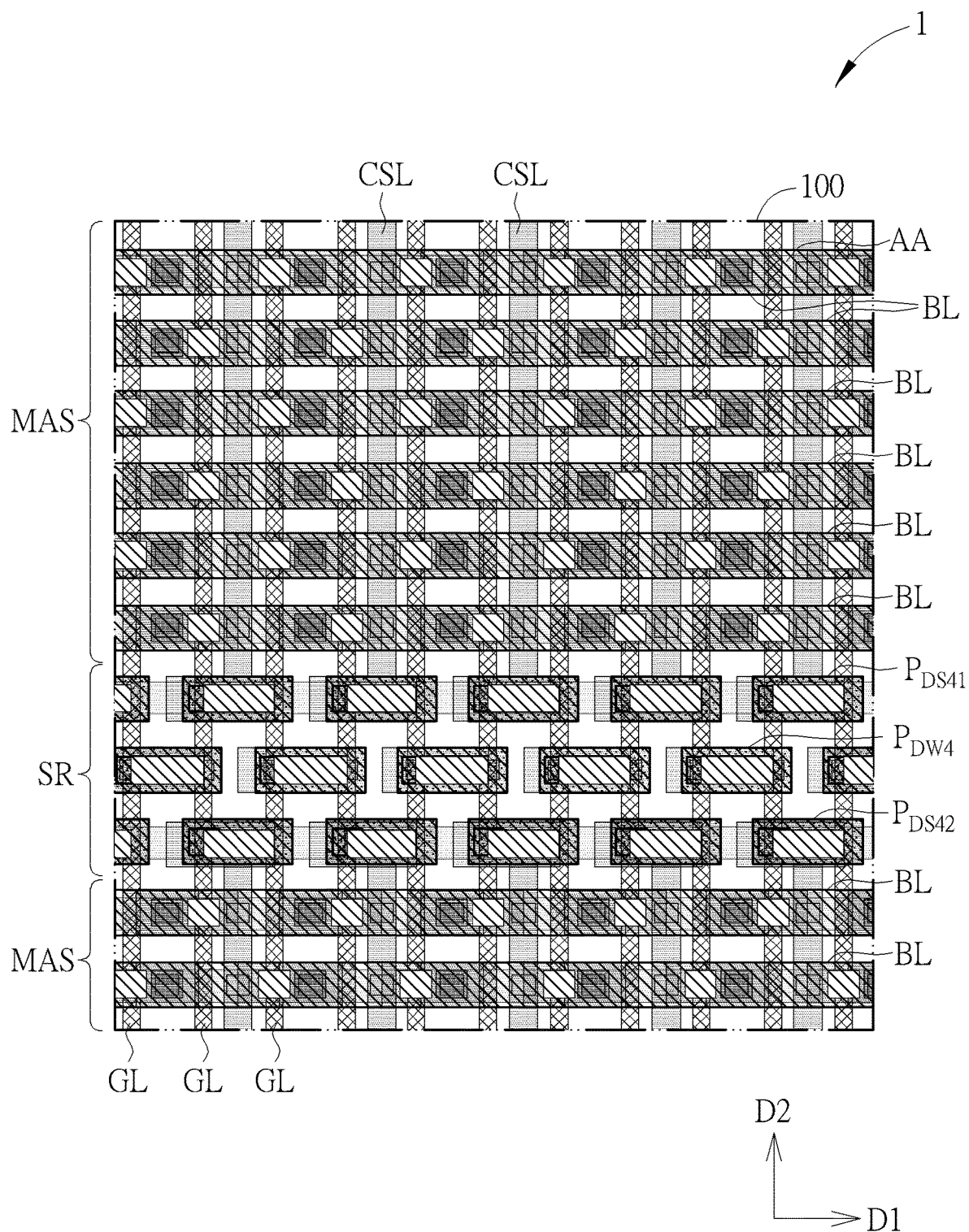
FIG. 8 is a schematic diagram of a memory array according to an embodiment of the present invention, which mainly shows the layout of the M4 metal layer.

Please refer to FIG. 8, which is a schematic diagram of a memory array according to an embodiment of the present invention, which mainly shows the layout of the M4 metal layer. As shown in FIG. 8, the memory array 1 further includes a plurality of bit lines BL in the M4 metal layer in the sub-arrays MAS, which are electrically connected to the corresponding conductive vias $V_{A3}$ in the same row in the first direction D1. According to an embodiment of the present invention, in the strap region SR, a plurality of staggered pads $P_{DS41}$, $P_{DW4}$, and $P_{DS42}$ are provided corresponding to the conductive vias $V_{DS31}$, the conductive vias $V_{DW3}$, and the conductive vias $V_{DS32}$.

Figure 9:
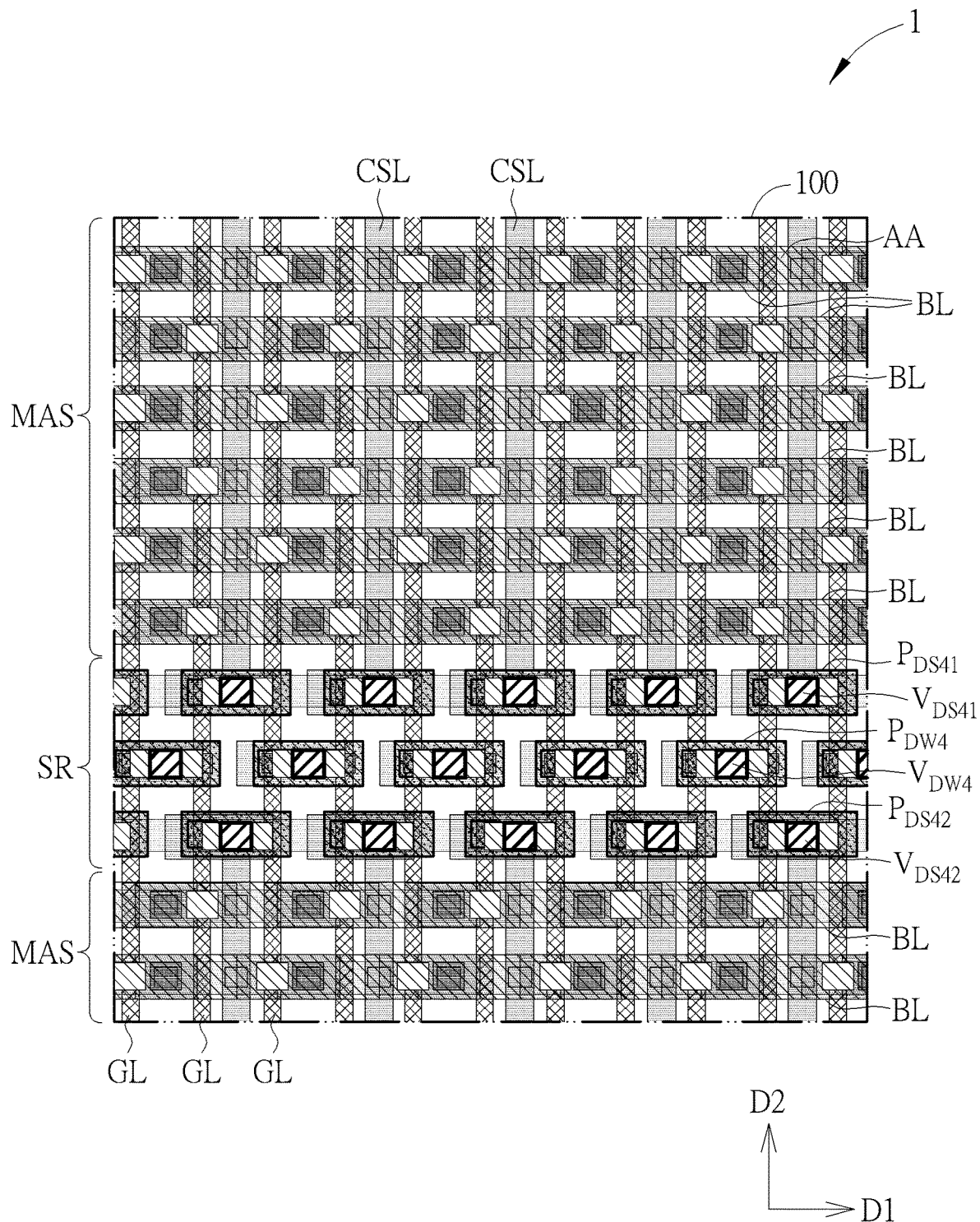
FIG. 9 is a schematic diagram of a memory array according to an embodiment of the present invention, which mainly shows the layout of the V4 conductive vias.

Please refer to FIG. 9, which is a schematic diagram of a memory array according to an embodiment of the present invention, which mainly shows the layout of V4 conductive vias. As shown in FIG. 9, the memory array 1 is provided with a plurality of conductive vias $V_{DS41}$, conductive vias $V_{DW4}$, and conductive vias $V_{DS42}$ in a staggered arrangement corresponding to the pads $P_{DS41}$, the pads $P_{DW4}$, and the pads $P_{DS42}$ in the strap region SR.

Figure 10:
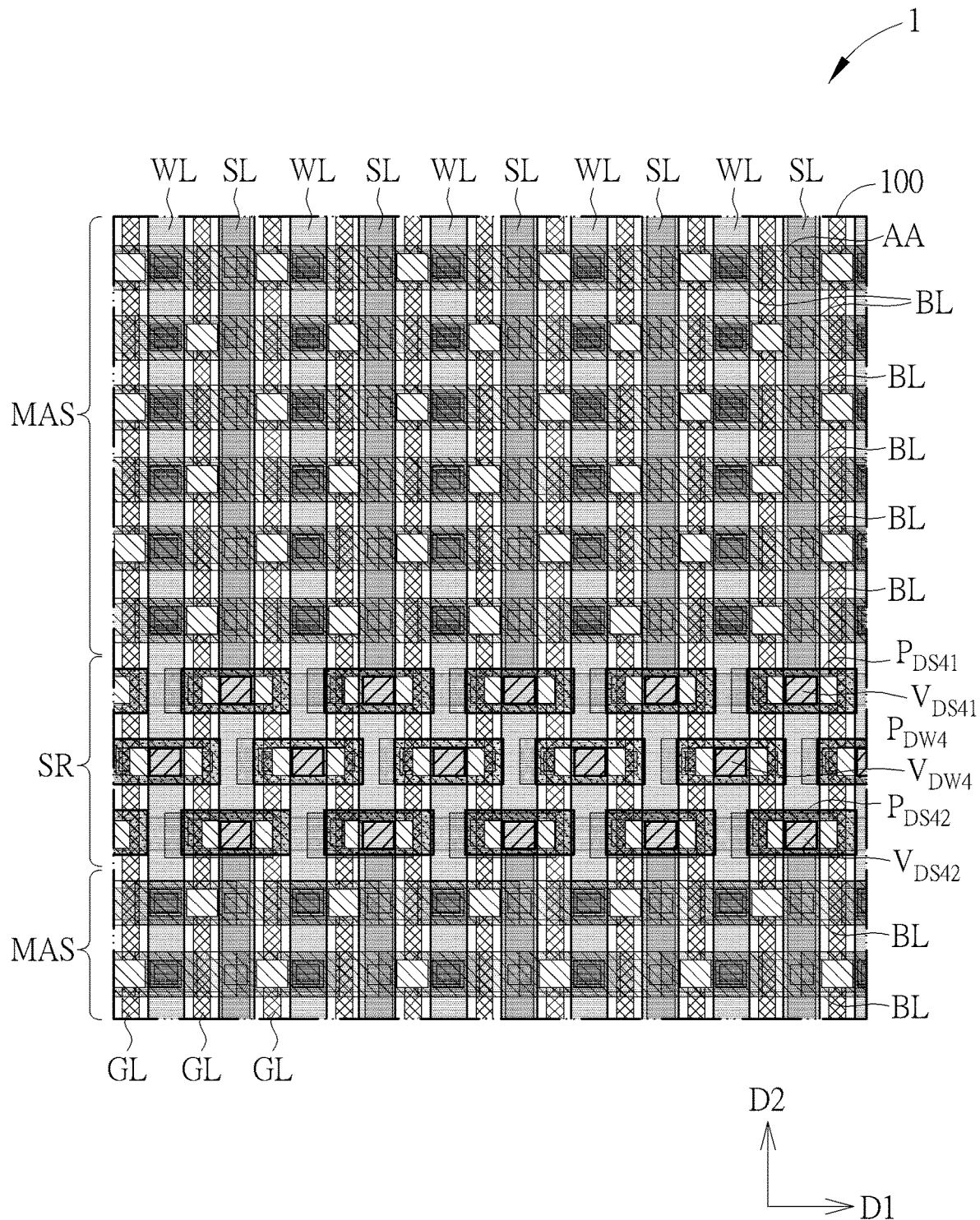
FIG. 10 is a schematic diagram of a memory array according to an embodiment of the present invention, which mainly shows the layout of the M5 metal layer.

Please refer to FIG. 10, which is a schematic diagram of a memory array according to an embodiment of the present invention, which mainly shows the layout of the M5 metal layer. As shown in FIG. 10, the memory array 1 further includes a plurality of word lines WL and source lines SL located in the M5 metal layer. The word lines WL and the source lines SL are parallel to each other and extend along the second direction D2. The word lines WL are electrically connected to the corresponding conductive vias $V_{DW4}$, and the source lines SL are electrically connected to the corresponding conductive vias $V_{DS41}$ and the conductive vias $V_{DS42}$.

Figure 11:
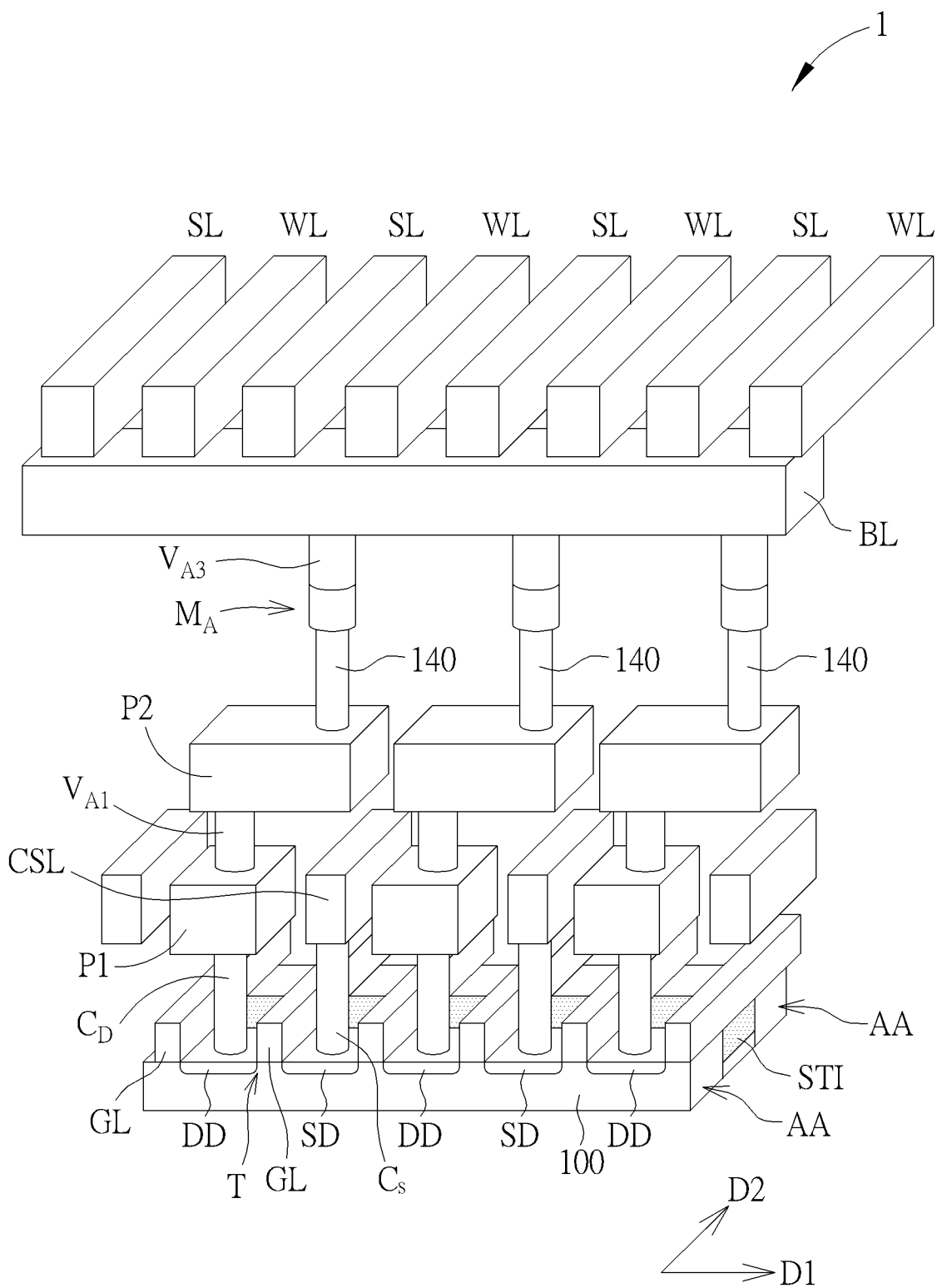
FIG. 11 is a three-dimensional schematic diagram of part of the structure in a sub-array of a memory array according to an embodiment of the present invention.

Please refer to FIG. 11, which is a three-dimensional schematic diagram of part of the structure in the sub-array of the memory array according to an embodiment of the present invention, wherein like regions, layers or elements are designated by like numeral numbers or labels. For the sake of simplicity, the dielectric layers are omitted in this figure. As shown in FIG. 11, the drain region DD of the transistor T is electrically connected to the corresponding pad P1 through the drain contact plug $C_D$, and then electrically connected to the corresponding storage node pad P2 through the conductive via $V_{A1}$. The storage node pad P2 extends toward the first direction D1 overlying the top of the common source line CSL. The tungsten via 140 is provided on the storage node pad P2. The tungsten via 140 is approximately aligned with the underlying gate line GL. The active magnetic storage element $M_A$ is directly disposed above the tungsten via 140, and the conductive via $V_{A3}$ is disposed directly above the active magnetic storage element $M_A$. The conductive via $V_{A3}$ is electrically connected to the bit line BL extending along the first direction D1. Above the bit line BL, word lines WL and source lines SL extend along the second direction D2.

Figure 12:
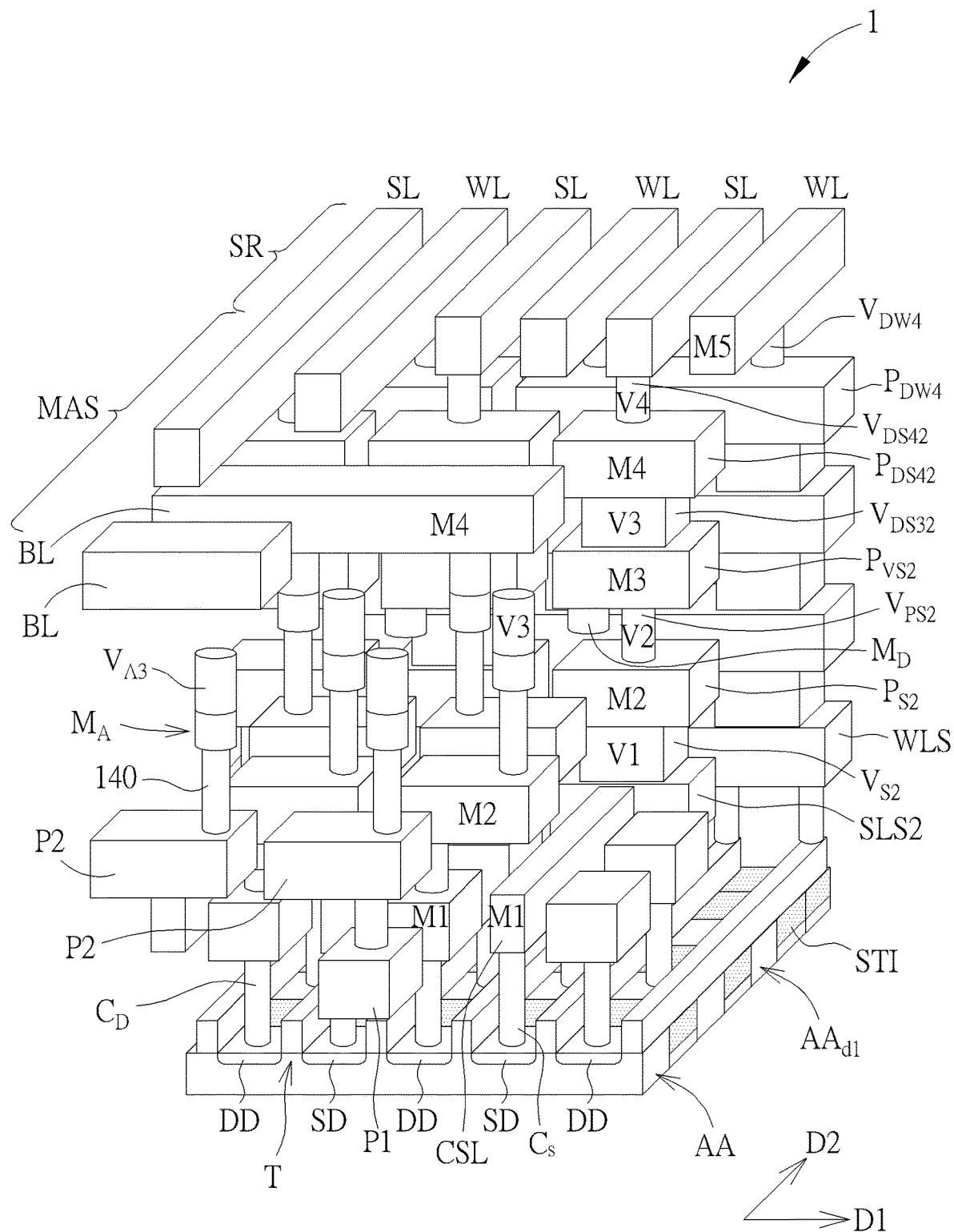
FIG. 12 is a three-dimensional schematic diagram of a part of the structure in a sub-array and a strap region of a memory array according to an embodiment of the present invention.

Please refer to FIG. 12, which is a three-dimensional schematic diagram of a part of the structure of the sub-array MAS and the strap region SR of the memory array according to an embodiment of the present invention, wherein like regions, layers or elements are designated by like numeral numbers or labels. As shown in FIG. 12, the active magnetic storage element $M_A$ and the dummy magnetic storage element $M_D$ are uniformly distributed in the sub-array MAS and the strap region SR in a staggered arrangement, realizing a high-density memory layout. The storage node pad P2 in the sub-array MAS and the pad $P_{S1}$, the pad $P_{S2}$, and the pad $P_W$ in the strap region SR are not aligned on a straight line in the second direction D1, but are arranged in a staggered arrangement. No tungsten vias are arranged on the pad $P_{S1}$, the pad $P_{S2}$, and the pad $P_W$ in the strap region SR. The bottom electrode of the dummy magnetic storage element $M_D$ is not directly electrically connected to the pad $P_W$ in the strap region SR. The conductive via $V_{PS2}$ is electrically connected to the underlying pad $P_{S2}$. The pad $P_{VS2}$ covers the conductive via $V_{PS2}$ and the dummy magnetic storage element $M_D$, and electrically connects the top electrode of the dummy magnetic storage element $M_D$ to the conductive via $V_{PS2}$. It can be clearly seen from FIG. 1 that the common source line CSL located in the M1 metal layer is electrically connected to the source line SL at M5 metal layer through the second source line strap $S_{LS2}$ and the connection paths constructed in V1, M2, V2, M3, V3, M4, and V4.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory array, comprising:
at least one strip-shaped strap region extending along a first direction and comprising a plurality of discontinuous source line straps and a plurality of discontinuous word line straps;
at least two sub-arrays comprising a plurality of staggered, active magnetic storage elements, wherein said at least two sub-arrays are separated by said at least one strip-shaped strap region, and wherein one of said at least two sub-arrays is disposed on an upper side of said at least one strip-shaped strap region, and the other one of said at least two sub-arrays is disposed on a lower side of said at least one strip-shaped strap region;
a plurality of common source lines extending along a second direction within said at least two sub-arrays, wherein one of said plurality of common source lines extended from said one of said at least two sub-arrays on said upper side of said at least one strip-shaped strap region is disconnected with one of said plurality of common source lines extended from said the other one of said at least two sub-arrays on said lower side of said at least one strip-shaped strap region in said at least one strip-shaped strap region and electrically connected to one of said plurality of source line straps; and
a plurality of staggered, dummy magnetic storage elements disposed within said at least one strip-shaped strap region.

2. The memory array according to claim 1, wherein said plurality of staggered, active magnetic storage elements and said plurality of staggered, dummy magnetic storage elements are uniformly distributed on said at least two sub-arrays and said at least one strip-shaped strap region.

3. The memory array according to claim 1, wherein said plurality of staggered, dummy magnetic storage elements comprises dummy magnetic tunneling junction (MTJ) elements.

4. The memory array according to claim 3, wherein bottom electrodes of said dummy MTJ elements are not electrically connected to said plurality of discontinuous source line straps or said plurality of discontinuous word line straps.

5. The memory array according to claim 1, wherein said plurality of discontinuous source line straps comprises a plurality of first source line straps extending along said first direction and a plurality of second source line straps extending along said first direction.

6. The memory array according to claim 5, wherein said plurality of first source line straps and said plurality of second source line straps extending along said first direction sandwich about said plurality of word line straps extending along said first direction.

7. The memory array according to claim 5, wherein each of said plurality of first source line straps is connected to each of said plurality of said common source lines extending along said second direction.

8. The memory array according to claim 7, wherein said first direction is orthogonal to said second direction.

9. The memory array according to claim 7 further comprising a plurality of gate lines extending along said second direction.

10. The memory array according to claim 9, wherein said plurality of staggered, active magnetic storage elements comprises a plurality of first active magnetic storage elements arranged in a first column and a plurality of second active magnetic storage elements arranged in a second column, wherein said plurality of first active magnetic storage elements arranged in said first column and said plurality of second active magnetic storage elements arranged in said second column are aligned with said plurality of gate lines extending along said second direction, respectively.

11. The memory array according to claim 5 further comprising a first dummy diffusion region extending along said first direction and wherein said first dummy diffusion region is disposed directly under said plurality of first source line straps.

12. The memory array according to claim 11 further comprising a second dummy diffusion region extending along said first direction and wherein said second dummy diffusion region is disposed directly under said plurality of second source line straps.

13. The memory array according to claim 12, wherein no diffusion region is disposed between said first dummy diffusion region and said second dummy diffusion region.

14. The memory array according to claim 1, wherein each of said plurality of staggered, active magnetic storage elements is electrically connected to a storage node pad through a tungsten via.

15. The memory array according to claim 1, wherein no tungsten via is disposed within said at least one strip-shaped strap region.

* * * * *